United States Patent
Popescu

(10) Patent No.: US 11,385,308 B2
(45) Date of Patent: Jul. 12, 2022

(54) MAGNETIC RESONANCE SCANNER WITH EMBEDDED QUANTUM COMPUTER

(71) Applicant: Siemens Healthcare GmbH, Erlangen (DE)

(72) Inventor: Stefan Popescu, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 390 days.

(21) Appl. No.: 16/702,743

(22) Filed: Dec. 4, 2019

(65) Prior Publication Data

US 2020/0209330 A1 Jul. 2, 2020

(30) Foreign Application Priority Data

Jan. 2, 2019 (EP) .................................... 19150076

(51) Int. Cl.
| | |
|---|---|
| *G01R 33/3815* | (2006.01) |
| *G06N 10/00* | (2022.01) |
| *F25B 9/10* | (2006.01) |
| *F25B 9/12* | (2006.01) |
| *G01R 33/38* | (2006.01) |
| *G01R 33/421* | (2006.01) |
| *H01F 6/04* | (2006.01) |

(Continued)

(52) U.S. Cl.
CPC ............ *G01R 33/3815* (2013.01); *F25B 9/10* (2013.01); *F25B 9/12* (2013.01); *G01R 33/3804* (2013.01); *G01R 33/4215* (2013.01); *G06N 10/00* (2019.01); *H01F 6/04* (2013.01); *H01F 6/065* (2013.01); *H01L 39/14* (2013.01)

(58) Field of Classification Search
CPC ............ G01R 33/3815; G01R 33/3804; G01R 33/4215; F25B 9/10; F25B 9/12; G06N 10/00; H01F 6/04; H01F 6/065; H01L 39/14
See application file for complete search history.

(56) References Cited

U.S. PATENT DOCUMENTS 8,618,799 B1 * 12/2013 Radparvar ......... G01R 33/3621
324/309
2007/0214802 A1 9/2007 Nemoto
(Continued)

FOREIGN PATENT DOCUMENTS

DE 3936914 A1 * 5/1990
EP 1808706 A1 7/2007
(Continued)

OTHER PUBLICATIONS

European Search Report for European Patent Application No. 19150076.8-1221 dated Jul. 12, 2019.
(Continued)

*Primary Examiner* — G. M. A Hyder
(74) *Attorney, Agent, or Firm* — Lempia Summerfield Katz LLC

(57) ABSTRACT

The present disclosure relates to a magnetic resonance (MR) scanner and magnetic resonance imaging (MRI) system. The MR scanner includes a superconducting magnet, a superconducting quantum processor, a first cooling system surrounding the superconducting magnet, and a second cooling system surrounding the superconducting quantum processor. The second cooling system is embedded in the first cooling system.

17 Claims, 3 Drawing Sheets

(51) Int. Cl.
*H01F 6/06* (2006.01)
*H01L 39/14* (2006.01)

(56) References Cited

U.S. PATENT DOCUMENTS

| | | |
|---|---|---|
| 2008/0176750 A1 | 7/2008 | Rose |
| 2008/0176751 A1 | 7/2008 | Tcaciuc |
| 2009/0122508 A1 | 5/2009 | Uchaykin |
| 2010/0157552 A1 | 6/2010 | Thom |
| 2010/0281885 A1 | 11/2010 | Black |
| 2021/0326739 A1* | 10/2021 | Jeffrey ................ H05K 7/2079 |

FOREIGN PATENT DOCUMENTS

| | | | |
|---|---|---|---|
| WO | WO-2009086430 A2 * | 7/2009 | ................ F25B 9/10 |
| WO | WO2009086430 A2 | 7/2009 | |
| WO | WO2014055293 A1 | 4/2014 | |

OTHER PUBLICATIONS

Silva, Afonso C., and Hellmut Merkle. "Hardware considerations for functional magnetic resonance imaging." Concepts in Magnetic Resonance Part A: An Educational Journal 16.1 (2003): 35-49.

* cited by examiner

MAGNETIC RESONANCE SCANNER WITH EMBEDDED QUANTUM COMPUTER

The present patent document claims the benefit of European Patent Application No. 19150076.8, filed Jan. 2, 2019, which is hereby incorporated by reference.

TECHNICAL FIELD

The present disclosure relates to a magnetic resonance (MR) scanner with an embedded quantum computer. The present disclosure furthermore relates to a magnetic resonance imaging (MRI) system.

BACKGROUND

Quantum computers are quantum mechanical systems using phenomena of superposition and entanglement of quantum mechanical states. Such computers are fundamentally different from binary digital computers using transistors. Whereas common digital computing requires that the data be encoded into binary digits, each of which is in one of two definite states, (i.e., zero or one), quantum computation uses quantum bits or qubits, which may be in superpositions of states.

Quantum computers may be used for solving computing-challenging problems that relate to performing linear algebra on multidimensional arrays, which may arise in the field of image reconstruction and image processing in medical imaging, including magnetic resonance imaging (MRI), computer tomography (CT), etc.

In recent times, performance of quantum computers seems to reach the 50-qubit benchmark. The 50-qubit benchmark is significant because around that point quantum machines become capable of performing calculations that may be difficult, if not impossible, to run on even the most enormous supercomputer available.

This technological progress opens a window of opportunity for the medical imaging business. A quantum computer may be used as a super-computer for every medical scanner in a hospital to run performant image reconstruction, image correction and image analysis algorithms without a need to move a huge amount of data into the cloud and thereby avoiding the data security related issue.

The most advanced quantum computers include superconducting processors. A superconducting quantum processor includes a number of superconducting qubits and associated local bias devices. Such a superconducting quantum processor requires an expensive refrigeration system for cooling the superconducting materials in the system generally realized in facilities that may accommodate the size, expense, complexity, and high maintenance demands.

A superconducting quantum processor of prior art requires an expensive refrigeration system for cooling the superconducting materials in the system including a cascaded cooling system having a pulse tube cryo-coolers, a cryogenic cycle refrigerator, and a dilution refrigerator. The coolant used for these refrigerators may include at least one of liquid He, $He^4$, or $He^3$. With this refrigerator system, the operating temperatures of the quantum processor and its connecting infrastructure is reduced over cascaded cooling stages successively from room temperature down to, e.g., 70K, then down to 4K, to 0.5K, until finally reaching 0.05K.

A medical imaging scanner, e.g., a magnetic resonance (MR) scanner using a superconducting magnet, needs a cryogenic cooling system as well. This cooling system uses liquid He as a coolant and a cold head as a cryogenic cooling engine to reduce the operating temperature of the superconducting coils from room temperature down to 4K.

SUMMARY AND DESCRIPTION

Due to that immense expenditure, there is still unmet need to make quantum computers available at affordable prices at hospitals or with a medical scanner, in particular with an MR scanner installation.

This object is met by the MR scanner and the MRI system. The scope of the present disclosure is defined solely by the appended claims and is not affected to any degree by the statements within this summary. The present embodiments may obviate one or more of the drawbacks or limitations in the related art.

The MR scanner includes a superconducting magnet, a superconducting quantum processor, and a multi-stage refrigeration system. The multi-stage refrigeration system includes a first cooling system surrounding the superconducting magnet and a second cooling system surrounding the superconducting quantum processor, wherein the second cooling system is embedded in the first cooling system. An important underlying idea of the disclosure is the combination of the cooling system of a superconducting quantum computer and a superconducting magnet. An MR scanner uses a superconducting magnet, which needs a cryogenic cooling system as well. As in prior art, this cooling method similarly depends on reliable supply of liquid Helium as a coolant and on a cold head as the cryogenic cooling engine used to reduce the operating temperature of the superconducting coils from room temperature down to 4K. By the combination of the superconducting quantum computer and a superconducting magnet the superconducting quantum processor benefits from the robust cooling infrastructure of the MR scanner including a vacuum insulated Helium vessel, a cold head based cryo-cooler, closed-circuit Helium-gas recycler with external refrigerator, service interface, and qualified service staff. On the other hand, the MR scanner benefits from the huge computing power available with the embedded superconducting quantum processor.

Using the cooling system for the superconducting magnet and for the superconducting quantum processor together simplifies the structure of the MR scanner, which leads to a better performance, efficiency, and lower cost of the MR scanner.

The MRI system includes a control unit and an MR scanner. The MRI system shares the advantages of the MR scanner.

According to an embodiment of the MR scanner, the superconducting quantum processor is positioned within a region inside the coils of the superconducting magnet such that the static magnetic field at the position of the superconducting quantum processor is comparatively low. This means that the value of the static magnetic field is at least lower than an average value of the magnetic field in-between the superconducting coils. The static magnetic field at the position of the superconducting quantum processor may be reduced to a minimum value. Reducing the magnetic field in the region of the superconducting quantum processor helps to reduce the perturbation of the superconducting quantum processor by the magnetic field, which leads to a better performance and a higher reliability of the superconducting quantum processor.

Further, the superconducting magnet may include main field coils and shield coils and the superconducting quantum processor may be positioned in a region inside the superconducting magnet coils in-between the main field coils and the shield coils such that the local magnetic field at the position of the superconducting quantum processor is reduced by a cancelling effect excited by the different coils. The reduction of the magnetic field by the cancelling effect in the region of the superconducting quantum processor helps to reduce the perturbation of the superconducting quantum processor by the magnetic field, which leads to a better performance and a higher reliability of the superconducting quantum processor.

The first cooling system may include two cooling stages and the second cooling system includes two additional cooling stages. Using a higher number of cooling stages enables a lower temperature to be reached in a shorter time, wherein the previous cooling stages pre-cool the system to a higher temperature with a high cooling performance and the successive cooling stages pre-cool the system from the higher temperature to a very low temperature with a comparatively low cooling performance.

The first cooling system may include a first liquid Helium based cooling stage and a second liquid Helium based cooling stage. Whereas the first cooling stage has a high cooling performance and reduces the temperature to 70K, the second cooling stage has a relatively low cooling performance compared to the 70K cooling stage and reduces the temperature from 70K to 4K. These two cooling stages may be used as well as for cooling the superconducting magnet, which needs a temperature of about 4K, and for cooling the superconducting quantum processor, which has to be cooled by two additional cooling stages to 0.05K.

Further, the MR scanner may include thermal radiation shields, which are designed for thermally insulating the first cooling system and the second cooling system. The thermal radiation shields reduce the heat input caused by thermal radiation.

Additionally, the MR scanner may further include a superconducting magnetic shield. The superconducting magnetic shield may also be designed as an enclosure surrounding the superconducting quantum processor. Such a magnetic shield may include a superconducting cylinder that is closed at one end. In this case, the superconducting cylinder suppresses the static magnetic field under a critical temperature based on the Meissner effect. The reduction of the magnetic field by the Meissner effect in the region of the superconducting quantum processor helps to reduce the perturbation of the superconducting quantum processor by the magnetic field, which leads to a better performance and a higher reliability of the superconducting quantum processor.

The mentioned thermal radiation shields may also be designed as superconducting magnetic shields. The combination of these different functions may be accomplished by using materials, which superconduct at the end temperature of a cooling stage, which is insulated by the respective thermal radiation shield.

Furthermore, the MR scanner may include an active magnetic shield around the superconducting quantum processor. An active magnetic shield uses a superconducting coil that generates a magnetic field to cancel the main magnetic field. The reduction of the magnetic field by an additional superconducting coil in the region of the superconducting quantum processor helps to reduce the perturbation of the superconducting quantum processor by the magnetic field, which leads to a better performance and a higher reliability of the superconducting quantum processor.

The superconducting magnetic shield may also include a superconducting coil that is connected in series to the superconducting magnet of the MR scanner. In this case, the current fed through the superconducting coil may be the same permanent current, which has been initially ramped up and circulates through the superconducting coils of the superconducting magnet for the static magnetic field of the MR scanner.

Advantageously no additional supply lines or control units are required for the superconducting magnetic shield.

At least one of the first cooling system and the second cooling system of the MR scanner may include a cascaded cooling system, wherein at least two cooling stages of the first cooling system and the second cooling system are thermally connected by a switchable thermal link. A switchable thermal link provides thermal coupling between a previous and a successive cooling stage, while the refrigeration system operates in a first temperature range of the previous cooling stage and provides substantial thermal insulation between the previous and a successive cooling stage, while the refrigeration system operates in a second, lower temperature range of the successive cooling stage. Advantageously, the thermal link accelerates the cooling process in the first temperature range and reduces the admission of energy to the successive cooling stage in the second temperature range.

Such a switchable thermal link may be designed as a passively switchable thermal link or a controllable or actively switchable thermal link. A passively switchable thermal link may be formed from a material that is superconducting below a critical temperature such that the switchable link is thermally conductive above the critical temperature of the material and insulating below the critical temperature. Such superconducting materials are, for example, metals like aluminum, tin, or lead that may exhibit high thermal conductivity until they are cooled below their critical temperature.

An actively switchable thermal link may be realized by a controllable thermal switch using a magnetic attractive or repulsive force, which is generated for example by a solenoid, which performs like a thermo-relay that actuates the thermal contact between two thermal terminals. An actively switchable thermal link may also be implemented as a gas-gap heat switch. Compared to a magnetic solenoid, a gas-gap heat switch does not need a control system because the gas-gap heat switch automatically performs as a thermo-relay at an adjusted switching temperature.

Additionally, the MR scanner may further include a magnet turret for accessing and servicing the superconducting magnet. The magnet turret is designed for additionally accessing and servicing the superconducting quantum processor. Advantageously the magnet turret may be used for the superconducting magnet as well as for the superconducting quantum processor, which simplifies the design of the MR scanner.

The MR scanner may include electrical interconnections between various cooling stages. These electrical interconnections include a filtering function for removing or at least strongly attenuating the non-differential external electromagnetic interference components as well as any differential interference located outside an operational signal bandwidth. Advantageously, the electrical noise, which affects the communication and control operations between an external control unit and the internal components, is reduced by the mentioned measurements.

The first cooling system of the multi-stage refrigeration system of the MR scanner may include a cold head for cycling Helium through the first cooling system and the enclosure of the superconducting quantum computer, the electrical interconnections and the cooling stages are mechanically attached to the cold head, such that the whole multi-stage refrigeration-system is removable outside an outer vacuum container surrounding the multi-stage refrigeration system via the service turret. Advantageously, the most important components of the refrigeration system are accessible by short time on purpose and/or for service activities.

BRIEF DESCRIPTION OF THE DRAWINGS

Other objects and features of the present disclosure will become apparent from the following detailed descriptions considered in conjunction with the accompanying drawings. It is to be understood, however, that the drawings are designed solely for the purposes of illustration and not as a definition of the limits of the disclosure. They are not necessarily drawn to scale.

DETAILED DESCRIPTION

Figure 1:
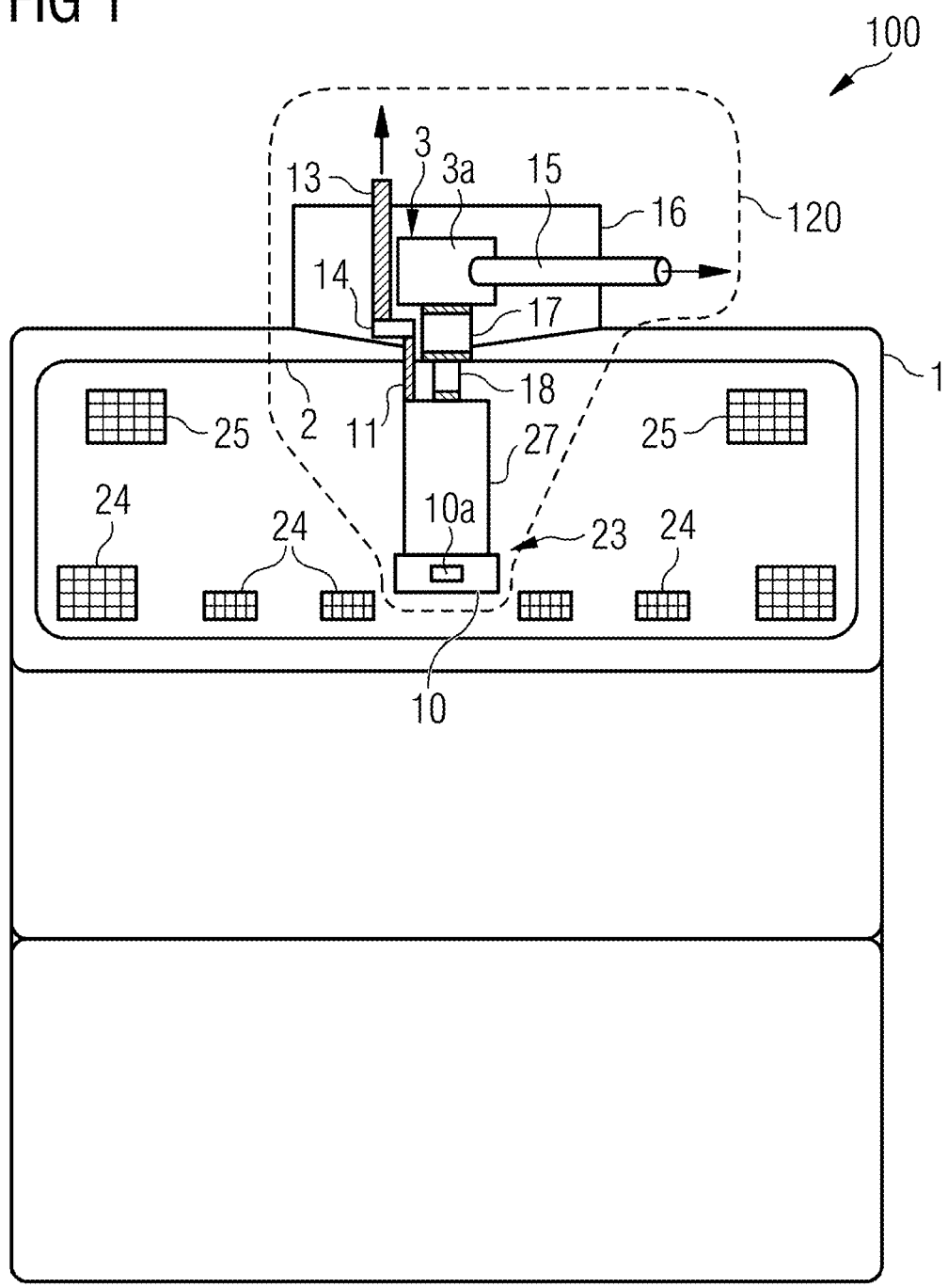
FIG. 1 depicts a schematic view of an MR scanner with a superconducting magnet with embedded superconducting quantum processor and common cooling infrastructure according to an embodiment.

FIG. 1 depicts an example of an MR scanner 100 including an MR superconducting magnet 24, 25 with an embedded superconducting quantum processor 10a and a shared cooling system 120 (marked by dotted lines). The MR scanner 100 includes an outer vacuum container 1, which encloses the superconducting magnet 24, 25, the superconducting quantum processor 10a, and all the cooling stages of the cooling system 120. The MR scanner 100 includes a service turret 16, which is used to access to the interior of the MR scanner 100. The cooling system 120 of the MR scanner 100 includes a first two-stage cooling system 3 with a two-stage cold head 3a, which may be accessed through the opened service turret 16. The first stage 17 of the first two-stage cooling system 3 is a liquid Helium based cooling-stage with a temperature of 70K and the second stage 18 of the first two-stage cooling system 3 is a liquid Helium based cooling-stage with a temperature of 4K. The second stage 18 cools a region 23, which contains the superconducting coils 24 of the superconducting magnet, some outer superconducting shielding coils 25, and which is surrounded by the thermal radiation shield 2. Further, the region 23 contains also a second cooling system 27 including a third cryo-cooling stage and a fourth cryo-cooling stage (e.g., shown in FIG. 2), which are used to attain temperatures of 0.5 K (third stage) and 0.05 K (fourth stage). The fourth cryo-cooling stage contacts a superconducting quantum processor enclosure 10. The superconducting quantum processor enclosure 10 contains the superconducting quantum processor 10a and is symmetrically positioned within the symmetry plane of the superconducting coils 24 of the MR scanner 100. Further, the MR scanner 100 also includes an electrical interface including bundles 11 of electrical cables in the cryogenically cooled region 23, a hermetically sealed feedthrough vacuum connector 14, which seals the interface between the cryogenically cooled region 23 and the outer environment, and an external interconnecting bundle 13 of electrical cables interconnecting electrical cables at room temperature.

Figure 2:
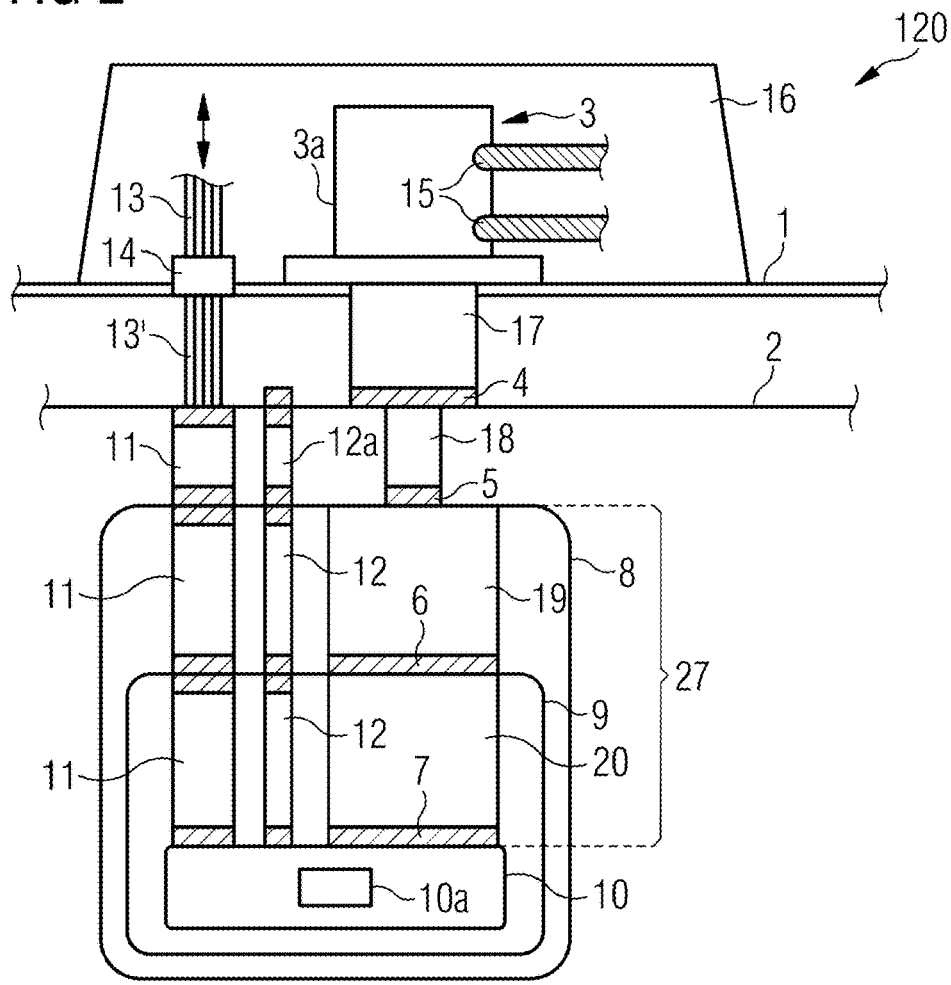
FIG. 2 depicts a schematic representation of an example of a multi-stage cooler for cooling a superconducting magnet and an embedded quantum processor.

FIG. 2 depicts a schematic view of a multi-stage refrigeration system 120, which similarly to FIG. 1 includes a service turret 16. In connection with the service turret 16 is a first cooling system 3 with a cold head 3a and with a first cooling stage 17 and a second cooling stage 18. Also connected with the service turret 16 is a bundle 13 of interconnecting electric cables. In connection with the first cooling system 3 is a second cooling system 27 with a third cooling stage 19 and a fourth cooling stage 20. Also, part of the multi-stage refrigeration system 120 are switchable thermal links 12, 12a. These thermal links 12, 12a may be used for a faster pre-cooling of a cooling stage 18, 19, 20 to the temperature of the previous cooling stage 17, 18, 19 and for separating thereafter the cooling stage 18, 19, 20 from the previous cooling stage 17, 18, 19 for further cooling down under the temperature of the previous cooling stage 17, 18, 19. In other words, cooling power of a cooling stage depends on the temperature of that stage, wherein more cooling power may be available at higher temperatures than at lower temperatures. Therefore, during the first phase of the cooling process, each cooling stage 18, 19, 20 is thermally coupled to the previous cooling stage 17, 18, 19 to accelerate the cooling process. For example, the first cooling stage 17 is used for cooling all cooling stages 17, 18, 19, 20 to a first temperature of the first cooling stage 17, the second cooling stage 18 pre-cools all successive cooling stages 19, 20 to the temperature of the second cooling stage 18, etc. After pre-cooling each cooling stage 18, 19, 20 to the temperature of the previous cooling stage 17, 18, 19, the cooling stage 18, 19, 20 is thermally separated from the previous cooling stage 17, 18, 19 for further cooling down using its own cooling source, which may be a Helium cooling system for the second cooling stage 18, an adsorption cooling system for the third cooling stage 19, and a dilution refrigerator for the fourth cooling stage 20. In other words, the multi-stage refrigeration system 120 is designed as a switchable pre-cooling system, wherein downstream cooling stages 18, 19, 20 and additionally thermally linked mechanisms, devices, or systems like thermal radiation shields 8, 9, the superconducting magnet 24, 25 and the quantum superconducting processor 10a are pre-cooled by previous cooling stages 17, 18, 19. A first switchable thermal link 12a is physically coupled between the first cooling stage 17 and the second cooling stage 18. The first switchable thermal link 12a is switchable between a thermally conductive state and a substantially thermally isolative state. The first switchable thermal link 12a provides thermal coupling between the first cooling stage 17 and the second stage 18 while the refrigeration system 120 operates in a first higher temperature range, for example above a temperature of 70K, and provides thermal insulation between the first stage 17 and the second stage 18 while the refrigeration system 120 operates in a second lower temperature range.

Such a thermal link 12a may be a passively switchable thermal link or an actively switchable thermal link. A passively switchable thermal link may include a material that is superconducting below a critical temperature such that the first switchable thermal link 12a is thermally insulating below the critical temperature $T_c$ and is thermally conductive above the critical temperature $T_c$. Such superconducting materials are metals like aluminum, tin, lead, etc., that are thermally conductive until they are cooled below their critical temperature $T_c$. After being cooled below their critical temperature $T_c$, these metals turn into the electrical superconducting state, wherein their thermal conductivity drops to a very low level. Using a superconducting metal as a switchable link between cooling stages also provides the possibility of simultaneously using the switchable link as electrical grounding for the same components.

Further, such a thermal link 12a may be a controllable or actively switchable thermal link. A controllable thermal link operates based on electrically driven magnetic attractive or repulsive forces, which may be generated by a solenoid. Such solenoid performs like a thermo-relay that actuates the thermal contact between two terminals. A switchable link may also include a gas-gap heat switch, which may be used as a suitable switchable thermal link.

The first cryogenic cooling system 3 includes a two-stage cold head 3a which serves as a port for filling in and cycling cooling fluids like liquid Helium. For this purpose, the two-stage cold head 3a includes some refrigerator He-pipes 15. The He-pipes 15 are used for providing the cooling system 3 with Helium and for removing the Helium from the cooling stages. The first cooling system 3 includes a first cooling stage 17, which is cooled by Helium and provides a temperature of 70 K. Between the cold head 3a and the first cooling stage 17 is an outer vacuum container wall 1, which separates the cooling region inside the MR scanner 100 from the outer environment. The first cooling system 3 further includes a second cooling stage 18, which is cooled down by Helium to 4K. Between the first cooling stage 17 and the second cooling stage 18 is a first cooling interface 4, which separates the 4K zone from the 70K zone. Further, these zones are separated by a thermal radiation shield 2. The first cooling system 3 is further connected to a second cooling system 27 that is provided in an additional container 8. The second cooling system 27 includes a third cooling stage 19 and a fourth cooling stage 20. The additional container 8 also serves as a second thermal radiation shield. The third cooling stage 19 includes an adsorption cooler, which cools down to 0.5K. Between the second cooling stage 18 and the third cooling stage 19 is a second cooling interface 5, also called cold finger. The fourth cooling stage 20 includes a dilution refrigerator using a composition of $^3$He/$^4$He and cools down to a temperature of 0.05K. Between the third cooling stage 19 and the fourth cooling stage 20 is a third cooling interface, which separates the 0.5K zone 19 from a 0.05K zone 20. Between the 0.5K zone 19 and the 0.05K zone 20 is also a third thermal radiation shield 9, which insulates the colder zone 20 from the warmer zone 19. Further the 0.05K zone defined by the third thermal radiation shield 9 also includes an enclosure 10 for a superconducting quantum processor 10a. The mentioned enclosure 10 also serves as a thermal radiation shield and a magnetic shield. As mentioned above, the cooling system 120 also includes a switchable thermal link system 12, 12a with thermal links between the first, the second, the third, the fourth cooling stage and the enclosure 10.

Furthermore, the cooling system 120 encloses an internal bundle 11 of electric cables for internal electrical interconnections and filters and an outer bundle 13 of electric cables and filters outside the He-cooled zone. The internal bundle 11 and the outer bundle 13 are part of an electrical interface 11, 13, 13', 14 to the quantum superconducting processor 10a. The electrical interface also includes an input/output system 13' and a vacuum connector 14. The electrical interface is used to provide operational power, to initialize and configure the semiconductor quantum processor 10a, and to retrieve the quantum computational results. The electrical interface connects a conventional computer (not shown) at a room temperature outside the outer vacuum container 1 (e.g., shown in FIG. 1) via, e.g., differential signal paths to the quantum superconducting processor cores 10a located within the evacuated and refrigerated enclosure 10 inside the outer vacuum container 1. The vacuum connector 14 provides an interface between the electronics outside the outer vacuum container 1, which is conducted at room temperature, and the portion of input/output system 13' that is located inside the evacuated vacuum container 1. The vacuum connector box 14 provides a hermetically sealed interface between the refrigerated internal zone inside the vacuum container 1 and the non-refrigerated outer environment, providing electrically conductive signal paths between outer and inner electronics.

The internal electrical interconnections 11 between various cooling stages also provide an electro-magnetic interference (abbreviated as EMI) filtering function to remove or at least to strongly attenuate the non-differential external EMI components. Further, any differential interference located outside the operational signal bandwidth, (e.g., spectral components in the microwave range), is removed or at least strongly attenuated by the mentioned function. The filter may be designed as single-ended or differential tubular filters. Such filters and interconnecting structures 11 are known from U.S. Patent Application Publication No. 2008/0176751 and U.S. Patent Application Publication No. 2010/0157552, for example.

The main body of the filter structure 11 may be formed by a predominately non-superconducting material such as copper or brass that provide very low thermal conductivity at low temperatures and improve the thermalization of the whole system.

Figure 3:
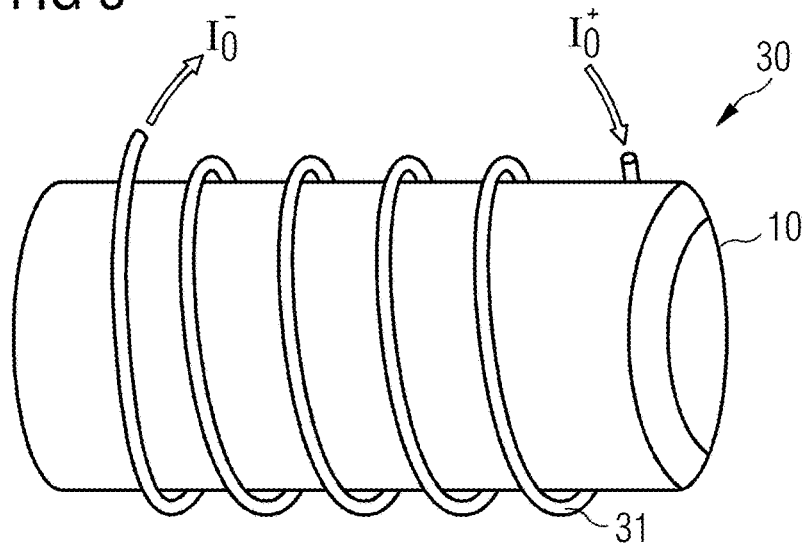
FIG. 3 depicts a schematic view of an enclosure of a superconducting quantum processor performing as a magnetic shield and as a thermal radiation shield, according to an embodiment.

FIG. 3 depicts a schematic view 30 of an enclosure 10 containing a superconducting quantum processor. The enclosure 10 performs as a magnetic shield and a thermal radiation shield. For minimizing the magnetic fields, the enclosure is located within a spatial region where the intensity of the static magnetic field is low. Furthermore, the enclosure 10 behaves as a superconducting magnetic shield by using the Meissner-Ochsenfeld effect. To realize the Meissner-Ochsenfeld effect, the enclosure 10 is made superconducting and closed at one end. As further shown in FIG. 3, the enclosure 10 is surrounded by a superconducting coil 31, which generates a magnetic field to cancel the main magnetic field generated by the superconducting magnet of the MR scanner. The permanent current $I_0$ ($I_0^+$ refers to the current flowing into the coil, $I_0^-$ refers to the current flowing out of the coil, the plotted arrows show the direction of the current) fed through the coil 31 may be the same permanent current that has been initially ramped up and circulates throughout the superconducting coils of the superconducting magnet of the MR scanner. It means that the superconducting magnet coils 24, 31 are connected in series. The enclosure 10 also behaves like a thermal radiation shield. Further, the whole refrigeration system 120 (e.g., shown in FIG. 2 or FIG. 1) includes multiple radiation shields 8, 9, 2 that are used to help to prevent blackbody radiation that is emitted by warmer bodies from being absorbed by colder bodies within the refrigeration system 120.

Figure 4:
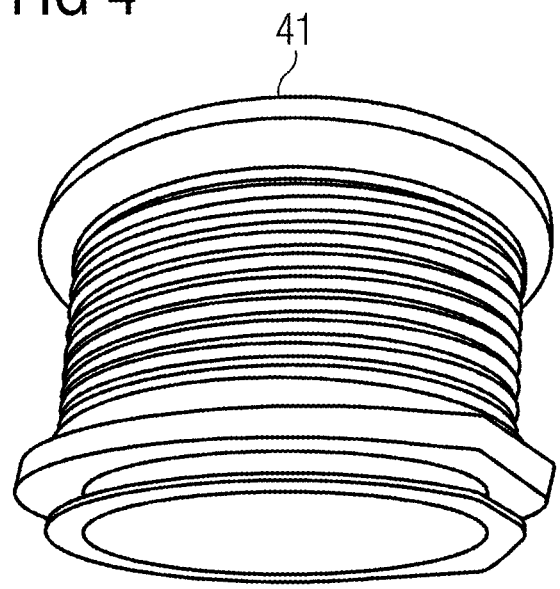
FIG. 4 depicts a perspective view of an example of a corrugated bellow used for minimizing mechanical vibrations in an MRI system.
Figure 5:
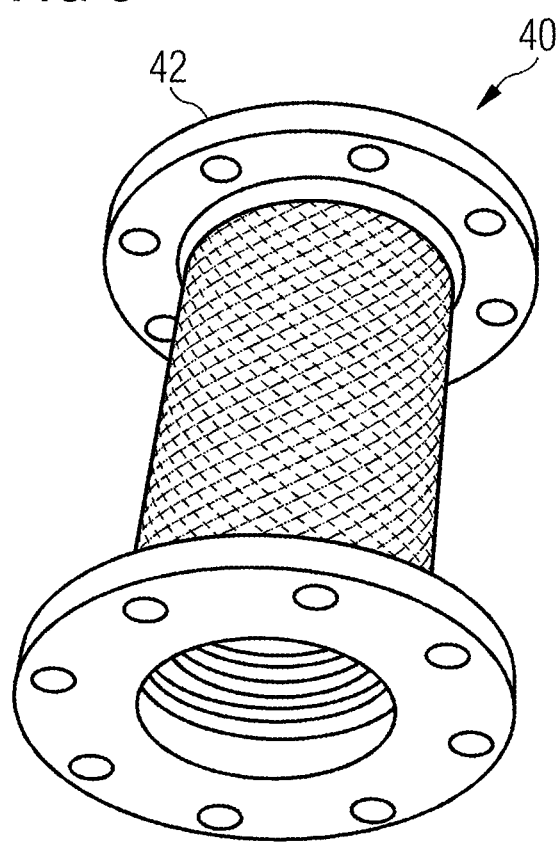
FIG. 5 depicts a perspective view of an example of a flexible hose used for minimizing mechanical vibrations in an MRI system.

In FIG. 4, a perspective view of a corrugated bellow 41 is depicted. In FIG. 5, a perspective view of a flexible hose 42 is depicted. During MR imaging, the pulsing gradient fields induce eddy currents into conducting parts and thereby mechanical vibrations. To deal with these perturbations, it would be possible to perform the quantum computations only in the time intervals in-between the MRI scans. The mechanical connection interfaces between the various components depicted in detail by FIG. 2 may be mechanically realized by corrugated bellows 41 or flexible hoses 42 that would dampen the mechanical vibrations. FIG. 4 and FIG. 5 depict exemplary mechanical components or devices that are used to realize at least the thermal radiation shields 8, 9, 10 respectively to mechanically enclose and to thermally attach to each other the adsorption cooler, the dilution refrigerator, and the superconducting quantum processor enclosure 10.

Although the present disclosure has been illustrated and described in the form of the exemplary embodiments and variations thereon, it will be understood that numerous additional modifications and variations may be made thereto without departing from the scope of the disclosure. It is therefore intended that the foregoing description be regarded as illustrative rather than limiting, and that it be understood that all equivalents and/or combinations of embodiments are intended to be included in this description. For the sake of clarity, it is to be understood that the use of 'a' or 'an' throughout this application does not exclude a plurality, and 'comprising' does not exclude other acts or elements.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

The invention claimed is:

1. A magnetic resonance (MR) scanner comprising:
a superconducting magnet;
a superconducting quantum processor; and
a multi-stage refrigeration system comprising:
    a first cooling system surrounding the superconducting magnet; and
    a second cooling system surrounding the superconducting quantum processor, wherein the second cooling system is embedded in the first cooling system.

2. The MR scanner of claim 1, wherein the superconducting quantum processor is positioned within a region inside coils of the superconducting magnet such that a magnetic field at a position of the superconducting quantum processor is comparatively low.

3. The MR scanner of claim 2, wherein the superconducting magnet comprises main field coils and shield coils and the superconducting quantum processor is positioned in a region inside the superconducting magnet coils in-between the main field coils and the shield coils such that a local magnetic field at the position of the superconducting quantum processor is reduced by a cancelling effect excited by the main field coils and the shield coils.

4. The MR scanner of claim 3, further comprising:
thermal radiation shields configured for thermally insulating cooling stages of the first cooling system and the second cooling system.

5. The MR scanner of claim 1, wherein the first cooling system comprises two cooling stages and the second cooling system comprises two additional cooling stages.

6. The MR scanner of claim 5, further comprising:
thermal radiation shields configured for thermally insulating the two cooling stages of the first cooling system and the two cooling stages of the second cooling system.

7. The MR scanner of claim 1, further comprising:
a superconducting magnetic shield.

8. The MR scanner of claim 7, wherein thermal radiation shields are additionally configured as the superconducting magnetic shield.

9. The MR scanner of claim 7, wherein the superconducting magnetic shield comprises a Meissner magnetic shield.

10. The MR scanner of claim 7, wherein the superconducting magnetic shield is configured as an enclosure surrounding the superconducting quantum processor.

11. The MR scanner of claim 10, further comprising:
an active magnetic shield as the enclosure.

12. The MR scanner of claim 10, wherein the superconducting magnetic shield comprises a superconducting coil connected in series to the superconducting magnet of the MR scanner.

13. The MR scanner of claim 1, wherein at least one of the first cooling system and the second cooling system comprises a cascaded cooling system,
wherein at least two cooling stages of the first cooling system and the second cooling system are thermally connected by a switchable thermal link.

14. The MR scanner of claim 1, further comprising:
a service turret configured for accessing and servicing the superconducting magnet and for accessing and servicing the superconducting quantum processor.

15. The MR scanner of claim 1, further comprising:
electrical interconnections between various cooling stages, the electrical interconnections comprising a filtering function for removing or at least strongly attenuating non-differential external electro-magnetic interference components as well as any differential interference located outside an operational signal bandwidth.

16. The MR scanner of claim 1, wherein the first cooling system comprises a cold head for cycling helium through the first cooling system, and
wherein an enclosure of the superconducting quantum processor, electrical interconnections, and cooling stages are mechanically attached to the cold head, such that the multi-stage refrigeration system is removable outside an outer vacuum container surrounding the multi-stage refrigeration system via a service turret.

17. A magnetic resonance imaging (MRI) system comprising:
a control unit; and
a magnetic resonance (MR) scanner in communication with the control unit, the MR scanner comprising:
    a superconducting magnet;
    a superconducting quantum processor; and
    a multi-stage refrigeration system comprising:
        a first cooling system surrounding the superconducting magnet; and
        a second cooling system surrounding the superconducting quantum processor, wherein the second cooling system is embedded in the first cooling system.

* * * * *